(12) United States Patent
Li et al.

(10) Patent No.: US 12,046,611 B2
(45) Date of Patent: Jul. 23, 2024

(54) SOLID-STATE IMAGE SENSOR

(71) Applicant: VisEra Technologies Company Limited, Hsin-Chu (TW)

(72) Inventors: Ching-Hua Li, Taoyuan (TW); Yu-Chi Chang, Hukou township, Hsinchu county (TW); Zong-Ru Tu, Zhubei (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 606 days.

(21) Appl. No.: 17/096,018

(22) Filed: Nov. 12, 2020

(65) Prior Publication Data

US 2022/0149097 A1 May 12, 2022

(51) Int. Cl.
H01L 27/146 (2006.01)
(52) U.S. Cl.
CPC .. *H01L 27/14623* (2013.01); *H01L 27/14621* (2013.01); *H01L 27/14627* (2013.01); *H01L 27/14645* (2013.01)
(58) Field of Classification Search
CPC ......... H01L 27/14623; H01L 27/14621; H01L 27/14627; H01L 27/14645
See application file for complete search history.

(56) References Cited

U.S. PATENT DOCUMENTS

| | | | | |
|---|---|---|---|---|
| 2009/0189055 A1* | 7/2009 | Lin | ................... | H01L 27/14621 250/208.1 |
| 2014/0339606 A1* | 11/2014 | Lin | ................... | H01L 27/14621 438/70 |
| 2015/0349001 A1 | 12/2015 | Wang et al. | | |
| 2017/0025458 A1* | 1/2017 | Lin | ................... | H01L 27/14645 |
| 2017/0084652 A1* | 3/2017 | Chang | ............... | H01L 27/14627 |
| 2017/0301718 A1* | 10/2017 | Chou | ..................... | G03B 13/36 |

FOREIGN PATENT DOCUMENTS

| | | |
|---|---|---|
| JP | 2011003622 A | 1/2011 |
| JP | 2012227474 A | 11/2012 |
| JP | 2017063171 A | 3/2017 |
| WO | WO2020003681 A1 | 1/2020 |

OTHER PUBLICATIONS

The Office Action of its corresponding JP application No. 2021-068669 issued on Mar. 29, 2022.

* cited by examiner

*Primary Examiner* — Brigitte A Paterson
(74) *Attorney, Agent, or Firm* — MUNCY, GEISSLER, OLDS & LOWE, P.C.

(57) ABSTRACT

A solid-state image sensor is provided. The solid-state image sensor includes a plurality of photoelectric conversion elements. The solid-state image sensor also includes a first color filter layer disposed above the photoelectric conversion elements and a second color filter layer disposed adjacent to the first color filter layer, which respectively have a plurality of first color filter segments and a plurality of second color filter segments. Moreover, the solid-state image sensor includes a first metal grid structure disposed between the first color filter layer and the second color filter layer. The solid-state image sensor also includes a second metal grid structure disposed between the first color filter segments and between the second color filter segments. The bottom of the first metal grid structure has a first grid width, and the bottom of the second metal grid structure has a second grid width narrower than the first grid width.

19 Claims, 12 Drawing Sheets

SOLID-STATE IMAGE SENSOR

BACKGROUND

Technical Field

The embodiments of the present disclosure relate to image sensors, and in particular they relate to solid-state image sensors that include metal grid structures having different grid widths.

Description of the Related Art

Solid-state image sensors (e.g., charge-coupled device (CCD) image sensors, complementary metal-oxide semiconductor (CMOS) image sensors, and so on) have been widely used in various image-capturing apparatuses such as digital still-image cameras, digital video cameras, and the like. The light-sensing portion in the solid-state image sensor may be formed at each of a plurality of pixels, and signal electric charges may be generated according to an amount of light received in the light-sensing portion. In addition, the signal electric charges generated in the light-sensing portion may be transmitted and amplified, whereby an image signal is obtained.

Recently, the trend has been for the pixel size of image sensors typified by CMOS image sensors to be reduced for the purpose of increasing the number of pixels to provide high-resolution images. However, while pixel size continues to decrease, there are still various challenges in the design and manufacturing of image sensors.

For example, an oblique incident light that directly radiates into the solid-state image sensor may be divided into a reflected light and a transmitted light. However, the reflected light and the transmitted light entering into the color filter segments with different colors at neighboring pixels will cause the reflected light and the transmitted light to have different energies. The different energies in the reflected light and the transmitted light cause different signal strengths at neighboring pixels with the same color, which is referred to as channel separation. The channel separation will cause image detection effect worse.

BRIEF SUMMARY

In some embodiments of the present disclosure, the solid-state image sensor includes metal grid structures having different grid widths, which may improve channel separation, thereby improving the quality of the image signal from the photoelectric conversion elements of the solid-state image sensors.

In accordance with some embodiments of the present disclosure, a solid-state image sensor is provided. The solid-state image sensor includes a plurality of photoelectric conversion elements. The solid-state image sensor also includes a first color filter layer disposed above the photoelectric conversion elements, and having a plurality of first color filter segments. The solid-state image sensor further includes a second color filter layer disposed above the photoelectric conversion elements and adjacent to the first color filter layer, and having a plurality of second color filter segments. Moreover, the solid-state image sensor includes a first metal grid structure disposed between the first color filter layer and the second color filter layer. The solid-state image sensor also includes a second metal grid structure disposed between the first color filter segments and between the second color filter segments. The bottom of the first metal grid structure has a first grid width, and the bottom of the second metal grid structure has a second grid width. The second grid width is narrower than the first grid width.

In some embodiments, the first color filter segments include green color filter segments, and the second color filter segments include blue/red color filter segments.

In some embodiments, the bottom of the second metal grid structure between the green color filter segments has a green grid width, and the bottom of the second metal grid structure between the blue/red color filter segments has a blue/red grid width that is different from the green grid width.

In some embodiments, the difference between the green grid width and the blue/red grid width is 0-50 nm.

In some embodiments, the solid-state image sensor further includes a partition grid structure disposed on the first metal grid structure and the second metal grid structure. In the cross-sectional view of the solid-state image sensor, the partition grid structure is divided into a plurality of partition grid segments.

In some embodiments, the partition grid structure has a partition grid width greater than or equal to the first grid width.

In some embodiments, the second metal grid structure has a shift relative to the center line of the corresponding partition grid segments in the edge area of the solid-state image sensor.

In some embodiments, the shift is variable.

In some embodiments, the second metal grid structure between the green color filter segments has a first shift and the second metal grid structure between the blue/red color filter segments has a second shift relative to the center line of the corresponding partition grid segments in the edge area of the solid-state image sensor, and the first shift and the second shift are different.

In some embodiments, the difference between the first shift and the second shift is 0-50 nm.

In some embodiments, in the horizontal direction, the second metal grid structure is shifted toward the side facing away from the incident light.

In some embodiments, the first color filter layer or the second color filter layer covers a portion of the second metal grid structure.

In some embodiments, the photoelectric conversion elements are arranged to correspond to a plurality of phase detection auto focus pixels, a plurality of first normal pixels surrounding the phase detection auto focus pixels, and a plurality of second normal pixels surrounding the first normal pixels.

In some embodiments, the first metal grid structure is disposed to correspond to a region between the phase detection auto focus pixels and the first normal pixels, and the second metal grid structure is disposed to correspond to a region between the first normal pixels and the second normal pixels.

In some embodiments, the first metal grid structure has a first grid height, and the second metal grid structure has a second grid height. The second grid height is lower than the first grid height.

In some embodiments, in the cross-sectional view of the solid-state image sensor, the first metal grid structure and the second grid structure are formed as trapezoids, triangles, or rectangles.

In some embodiments, the solid-state image sensor further includes a plurality of condensing structures disposed on the first color filter layer and the second color filter layer.

In some embodiments, thicknesses of the condensing structures are different.

In some embodiments, the ratio of the second grid width to the first grid width is 0.25-0.9.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Solid-state image sensors may be roughly classified into two groups in terms of the direction of light incident on a light receiving unit. One is the front-side illuminated (FSI) image sensors that receive light incident on the front side of a semiconductor substrate on which the wiring layer of the reading circuit is formed. Another is the back-side illuminated (BSI) image sensors that receive light incident on the back side of a semiconductor substrate on which no wiring layer is formed. For imaging a color image, color filter layers may be provided in the FSI and BSI image sensors.

Figure 1:
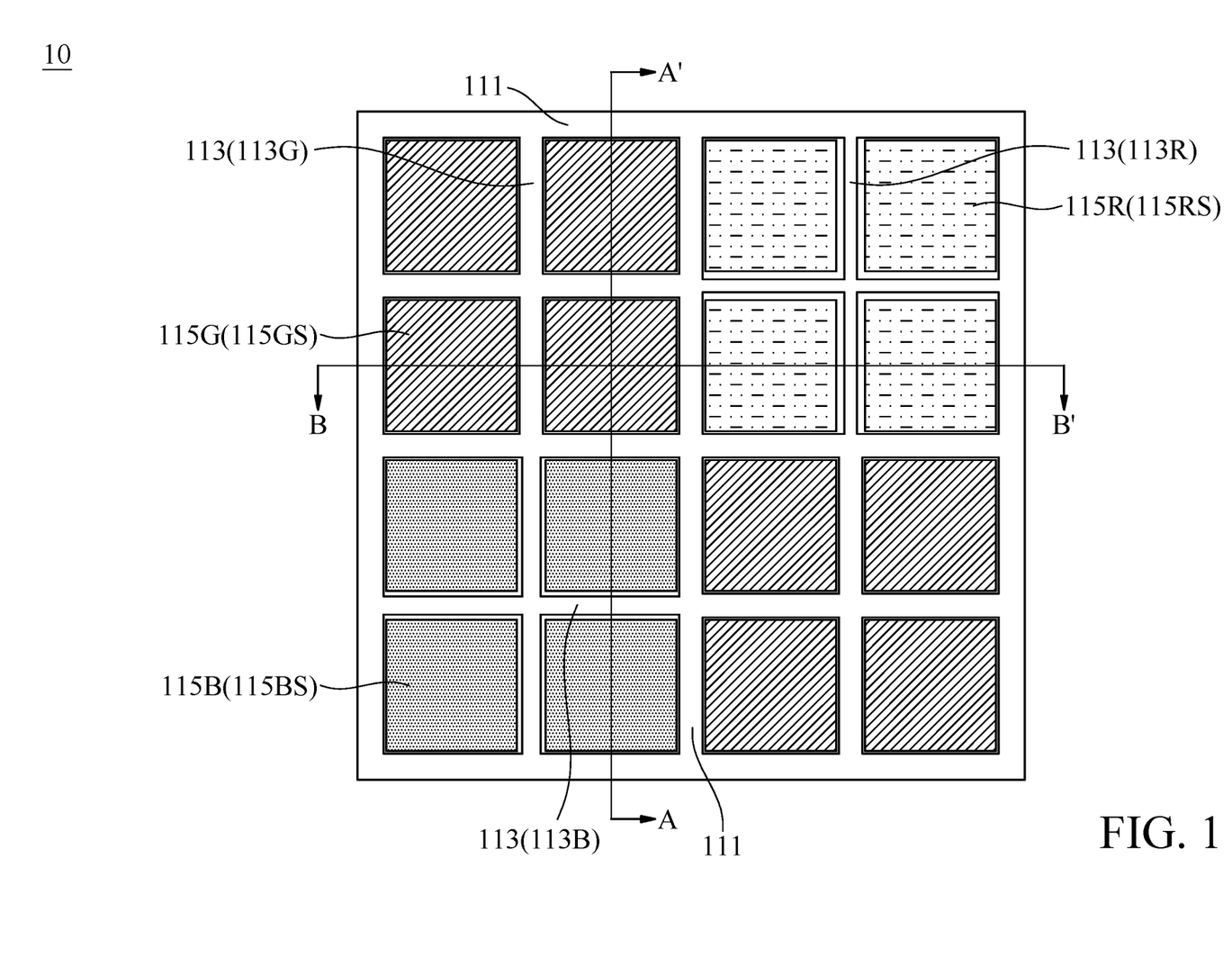
FIG. 1 is a top view illustrating a solid-state image sensor according to one embodiment of the disclosure.
Figure 2:
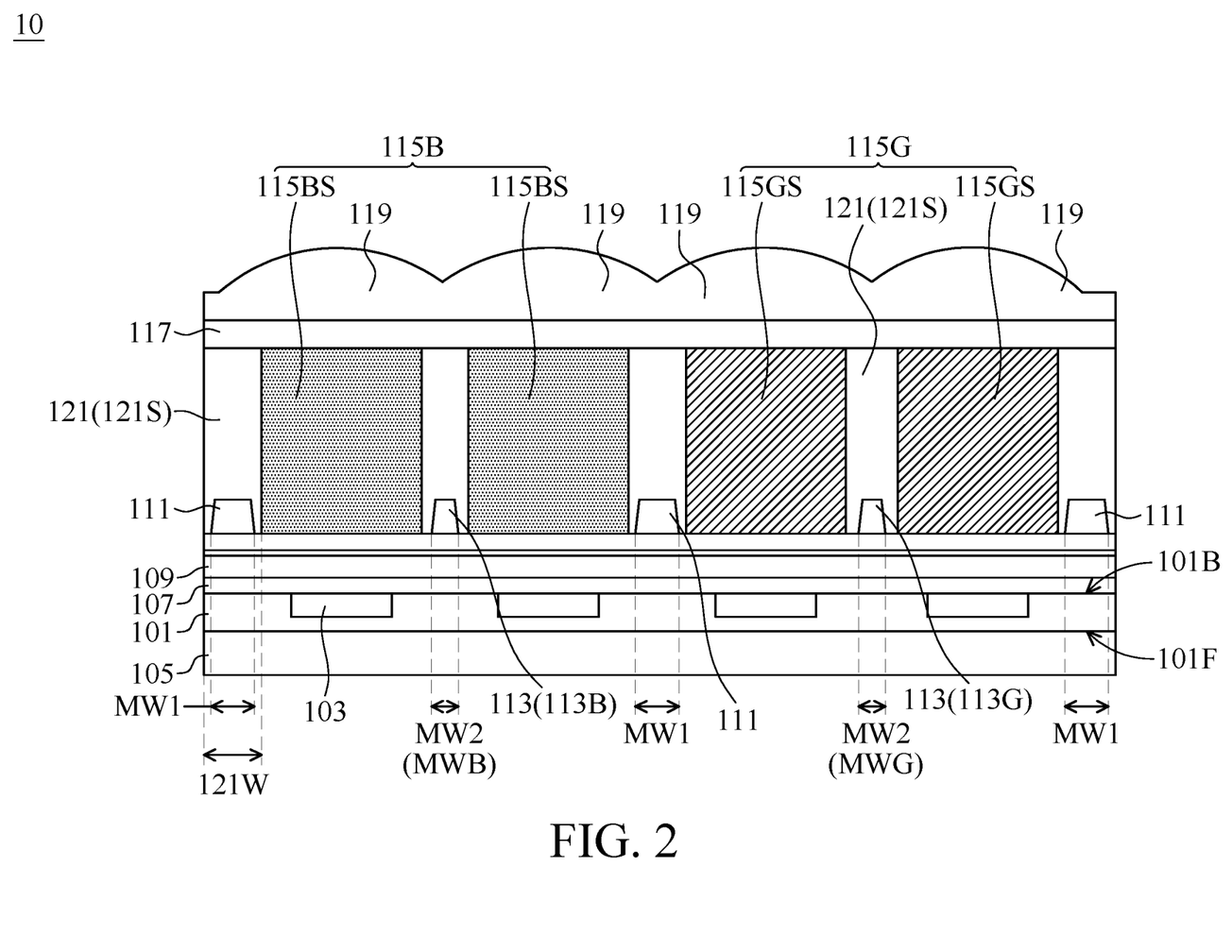
FIG. 2 is a cross-sectional view of the solid-state image sensor along line A-A' in FIG. 1.
Figure 3:
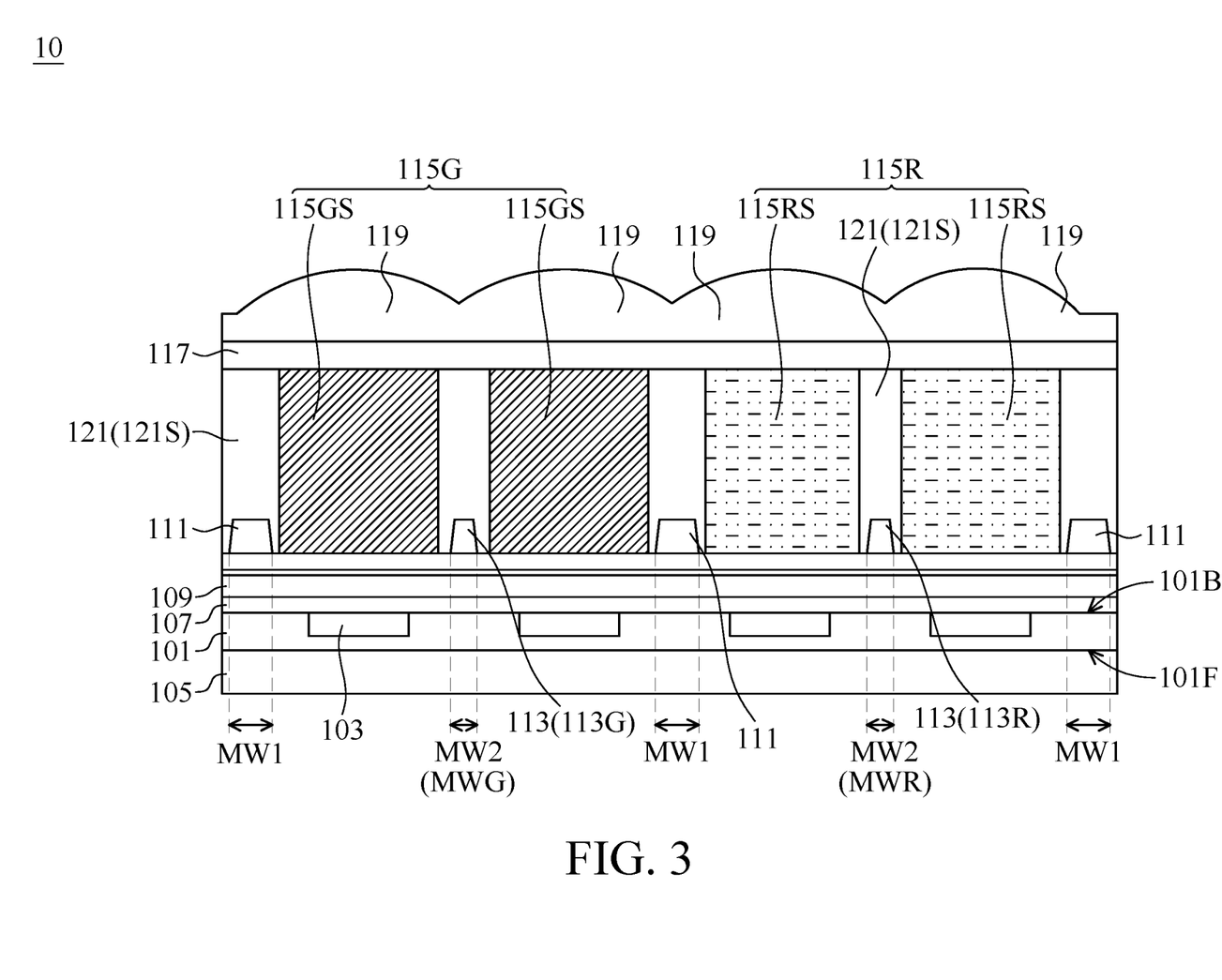
FIG. 3 is a cross-sectional view of the solid-state image sensor along line B-B' in FIG. 1.

FIG. 1 is a top view illustrating a solid-state image sensor 10 according to one embodiment of the disclosure. FIG. 2 is a cross-sectional view of the solid-state image sensor 10 along line A-A' in FIG. 1. FIG. 3 is a cross-sectional view of the solid-state image sensor 10 along line B-B' in FIG. 1. It should be noted that some components of the solid-state image sensor 10 may be omitted in FIG. 1 to FIG. 3 for the sake of brevity.

In some embodiments, the solid-state image sensor 10 may be a complementary metal-oxide semiconductor (CMOS) image sensor or a charge coupled device (CCD) image sensor, but the present disclosures is not limited thereto. As shown in FIG. 2 and FIG. 3, the solid-state image sensor 10 includes a semiconductor substrate 101 which may be, for example, a wafer or a chip, but the present disclosure is not limited thereto. The semiconductor substrate 101 has a front surface 101F and a back surface 101B opposite to the front surface 101F. A plurality of photoelectric conversion elements 103 such as photodiodes may be formed in the semiconductor substrate 101.

In some embodiments, the photoelectric conversion elements 103 in the semiconductor substrate 101 may be isolated from each other by isolation structures (not shown) such as shallow trench isolation (STI) regions or deep trench isolation (DTI) regions. The isolation structures may be formed in the semiconductor substrate 101 using etching process to form trenches and filling the trenches with an insulating or dielectric material.

In some embodiments, the photoelectric conversion elements 103 are formed on the back surface 101B of the semiconductor substrate 101, and a wiring layer 105 is formed on the front surface 101F of the semiconductor substrate 101, but the present disclosure is not limited thereto. The wiring layer 105 may be an interconnect structure that includes multiple conductive lines and vias embedded in multiple dielectric layers, and may further include various electric circuits required for the solid-state image sensor 10. Incident lights may radiate onto the side of the back surface 101B and be received by the photoelectric conversion elements 103.

The solid-state image sensor 10 as shown in FIG. 2 and FIG. 3 is referred to as a back-side illuminated (BSI) image sensor, but the present disclosure is not limited thereto. In some other embodiments, the solid-state image sensor may be a front-side illuminated (FSI) image sensor. The semiconductor substrate 101 and the wiring layer 105 as shown in FIG. 2 and FIG. 3 may be inverted for FSI image sensor. In the FSI image sensor, incident lights radiate onto the side of the front surface 101F, pass through the wiring layer 105 and then are received by the photoelectric conversion elements 103 formed on the back surface 101B of the semiconductor substrate 101.

As shown in FIG. 2 and FIG. 3, in some embodiments, the solid-state image sensor 10 may also include a high dielectric-constant (high-κ) film 107 formed on the back surface 101B of the semiconductor substrate 101 and covering the photoelectric conversion elements 103. The material of the high-κ film 107 may include hafnium oxide ($HfO_2$), hafnium tantalum oxide (HfTaO), hafnium titanium oxide (HfTiO), hafnium zirconium oxide (HfZrO), tantalum pentoxide ($Ta_2O_5$), other suitable high-κ dielectric materials, or a combination thereof, but the present disclosure is not limited thereto. The high-κ film 107 may be formed by a deposition process. The deposition process is, for example, chemical vapor deposition (CVD), plasma enhanced chemical vapor deposition (PECVD), atomic layer deposition (ALD), or another deposition technique. The high-κ film 107 may have a high-refractive index and a light-absorbing ability.

As shown in FIG. 2 and FIG. 3, in some embodiments, the solid-state image sensor 10 may further include a buffer layer 109 formed on the high-κ film 107. The material of the buffer layer 109 may include silicon oxides, silicon nitrides, silicon oxynitrides, other suitable insulating materials, or a combination thereof, but the present disclosure is not limited thereto. The buffer layer 109 may be formed by a deposition process. The deposition process is, for example, spin-on coating, chemical vapor deposition, flowable chemical vapor deposition (FCVD), plasma enhanced chemical vapor deposition, physical vapor deposition (PVD), or another deposition technique.

Referring to FIG. 1 to FIG. 3, the solid-state image sensor 10 includes a green color filter layer 115G, a blue color filter layer 115B, and a red color filter layer 115R disposed above the photoelectric conversion elements 103. In more detail, the green color filter layer 115G has a plurality of green color filter segments 115GS, the blue color filter layer 115B has a plurality of blue color filter segments 115BS, and the red color filter layer 115R has a plurality of red color filter segments 115RS.

In some embodiments, the blue color filter layer 115B is disposed adjacent to the green color filter layer 115G as shown in FIG. 1 and FIG. 2, and the red color filter layer 115R is disposed adjacent to the green color filter layer 115G as shown in FIG. 1 and FIG. 3, but the present disclosure is not limited thereto. In some other embodiments, the solid-state image sensor 10 may also include a white color filter layer or a yellow color filter layer.

Referring to FIG. 1 to FIG. 3, the solid-state image sensor 10 includes a first metal grid structure 111 and a second metal grid structure 113. In more detail, the first metal grid structure 111 is disposed between the green filter layer 115G and the blue filter layer 115B as show in FIG. 1 and FIG. 2, and between the green filter layer 115G and the red filter layer 115R as show in FIG. 1 and FIG. 3; the second metal grid structure 113 is disposed between the green color filter segments 115GS, between the blue color filter segments 115BS, and between the red color filter segments 115RS as shown in FIG. 1 to FIG. 3, but the present disclosure is not limited thereto.

As shown in FIG. 2 and FIG. 3, in the cross-sectional view of the solid-state image sensor 10, the first metal grid structure 111 and the second grid structure 113 are formed as trapezoids, but the present disclosure is not limited thereto. In the embodiments of the present disclosure, the bottom of the first metal grid structure 111 has a first grid width MW1, and the bottom of the second metal grid structure 113 has a second grid width MW2 that is narrower than the first grid width MW1. In some embodiments, the ratio of the second grid width MW2 to the first grid width MW1 may be about 0.25 to about 0.9 (i.e., MW2/MW1=0.25 to 0.9), but the present disclosure is not limited thereto.

In some embodiments, the material of the first metal grid structure 111 and the second metal grid structure 113 may include tungsten (W), aluminum (Al), metal nitride (e.g., titanium nitride (TiN)), other suitable materials, or a combination thereof, but the present disclosure is not limited thereto. The first metal grid structure 111 and the second metal grid structure 113 may be formed by depositing a metal layer on the buffer layer 109 and then patterning the metal layer using photolithography and etching processes to form the first metal grid structure 111 and the second metal grid structure 113, but the present disclosure is not limited thereto.

In some embodiments, the second metal grid structure 113 between the green color filter segments 115GS may be referred to as the second metal grid structure 113G as shown in FIG. 1 to FIG. 3, the second metal grid structure 113 between the blue color filter segments 115BS may be referred to as the second metal grid structure 113B as shown in FIG. 1 and FIG. 2, and the second metal grid structure 113 between the red color filter segments 115RS may be referred to as the second metal grid structure 113R as shown in FIG. 1 and FIG. 3. Moreover, the bottom of the second metal grid structure 113G between the green color filter segments 115GS has a green grid width MWG, the bottom of the second metal grid structure 113B between the blue color filter segments 115BS has a blue grid width MWB, and the bottom of the second metal grid structure 113R between the red color filter segments 115RS has a red grid width MWR.

In some embodiments, the second grid width MW2 may be variable. For example, the blue grid width MWB may be different from the green grid width MWG as shown in FIG. 1 and FIG. 2, and the red grid width MWR may be different from the green grid width MWG as shown in FIG. 1 and FIG. 3, but the present disclosure is not limited thereto. In some embodiments, the difference between the green grid width MWG and the blue grid width MWB or the difference between the green grid width MWG and the red grid width MWR may be about 0-50 nm (i.e., MWR-MWG=0±50 nm or MWB-MWG=0±50 nm), but the present disclosure is not limited thereto.

As shown in FIG. 2 and FIG. 3, in some embodiments, the solid-state image sensor 10 may include a partition grid structure 121 disposed on the first metal grid structure 111 and the second metal grid structure 113. As shown in FIG. 2 and FIG. 3, in the cross-sectional view of the solid-state image sensor 10, the partition grid structure 121 may be divided into a plurality of partition grid segments 121S.

In some embodiments, the material of the partition grid structure 121 may include a transparent dielectric material that has a low refractive index in a range from about 1.0 to about 1.99. Moreover, in the embodiments of the present disclosure, the refractive index of the partition grid structure 121 may be lower than the refractive index of the green color filter layer 115G, the refractive index of the blue color filter layer 115B, and the refractive index of the red color filter layer 115R.

As shown in FIG. 2, the partition grid structure 121 (the partition grid segment 121S) has a partition grid width 121W. In some embodiments, the partition grid width 121W may be greater than or equal to the first grid width MW1 of the bottom of the first metal grid structure 111. That is, the partition grid structure 121 may cover the first metal grid structure 111 and the second metal grid structure 113, but the present disclosure is not limited thereto.

As a result of measurement of sensitivities at different pixels (i.e., different color filter segments) of the same color, in the solid-state imaging device 10 according to the embodiments of the present disclosure, the sensitivity difference at Gr pixels (e.g., green color filter segment 115GS corresponding to FIG. 3) is about 12.4% (normalize sensitivity), and the sensitivity difference at Gb pixels (e.g., green color filter segment 115GS corresponding to FIG. 2) is about 9.9%. However, in traditional solid-state imaging device without metal grid structures having different grid widths, the sensitivity difference at Gr pixels is about 16.1% (normalize sensitivity), and the sensitivity difference at Gb pixels is about 13%. The above mentioned result proves that the solid-state imaging device 10 according to the embodiments of the present disclosure can make the sensitivities more consistent at different pixels of the same color. Therefore, the issue of channel separation may be improved, thereby improving the quality of the image signal from the photoelectric conversion elements of the solid-state image sensors.

As shown in FIG. 2 and FIG. 3, in some embodiments, the solid-state image sensor 10 may include a transparent layer 117 disposed on the color filter layers (e.g., the green color filter layer 115G, the blue color filter layer 115B, the red color filter layer 115R) and the partition grid structure 121. In some embodiments, the material of the transparent layer 117 may include glass, epoxy resin, silicone resin, polyurethane, any other applicable material, or a combination thereof, but the present disclosure is not limited thereto.

As shown in FIG. 2 and FIG. 3, in some embodiments, the solid-state image sensor 10 may include a plurality of condensing structures 119 disposed on the color filter layers (e.g., the green color filter layers 115G, the blue color filter layers 115B, the red color filter layers 115R) for condensing incident light. In particular, the condensing structures 119 may be disposed on transparent layer 117, but the present disclosure is not limited thereto. In some embodiments, the material of the condensing structure 119 may be the same as or similar to the material of the transparent layer 117, but the present disclosure is not limited thereto.

In some embodiments, the condensing structure 119 may be a micro-lens structure, such as a semi-convex lens or a convex lens, but the present disclosure is not limited thereto. In some other embodiments, the condensing structure 119 may be micro-pyramid structures (e.g., circular cone, quadrangular pyramid, and so on), or may be micro-trapezoidal structures (e.g., flat top cone, truncated square pyramid, and so on). Alternatively, the condensing structure 119 may be a gradient-index structure.

In the embodiment shown in FIG. 2 and FIG. 3, each condensing structure 119 corresponds to one of the green color filter segments 115GS, one of the blue color filter segments 115BS, or one of the red color filter segments 115RS, but the present disclosure is not limited thereto. In some other embodiments, each condensing structure 119 may correspond to at least two green color filter segments 115GS, at least two blue color filter segments 115BS, or at least two red color filter segments 115RS.

Figure 4:
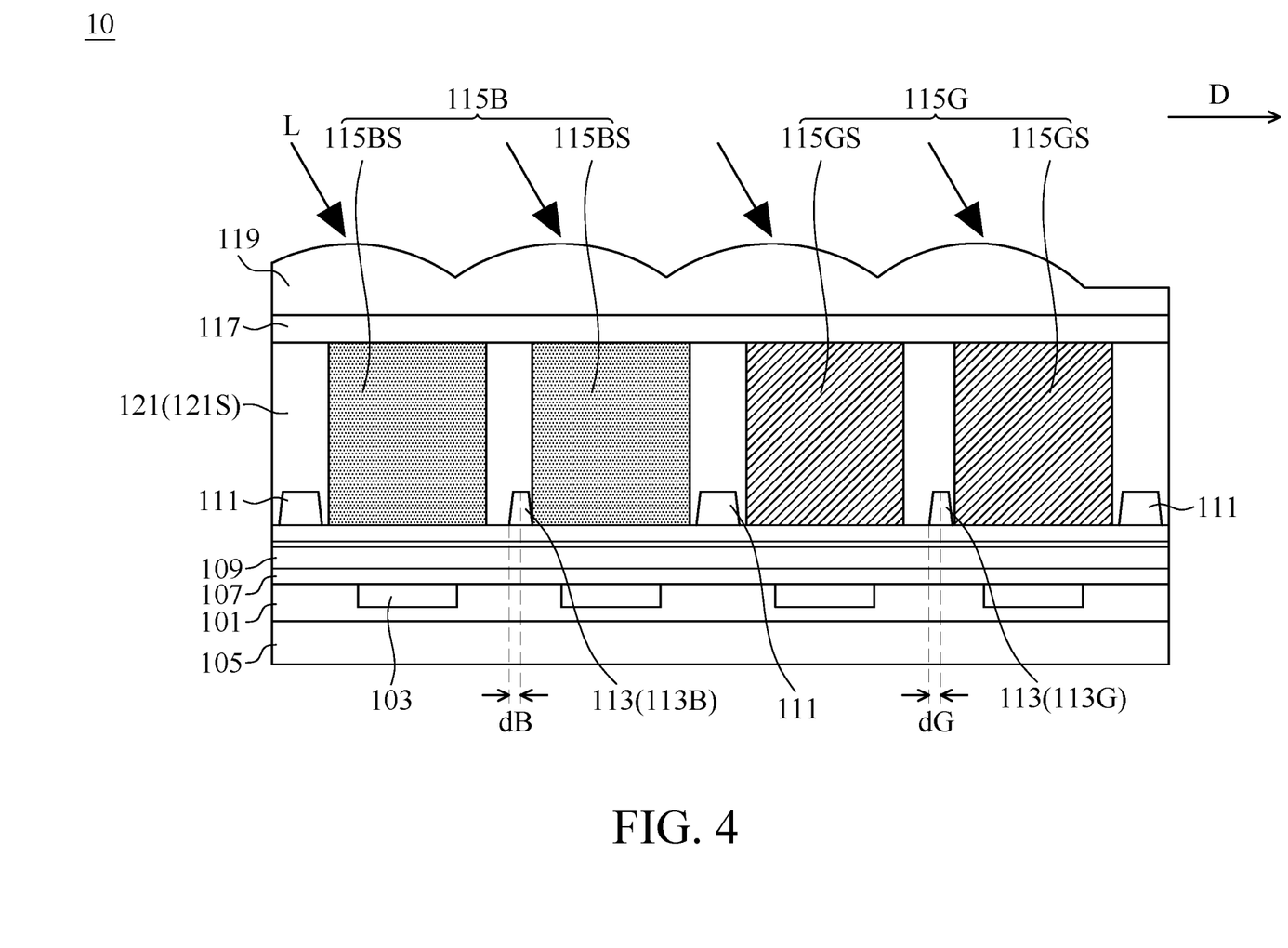
FIG. 4 is another cross-sectional view of the solid-state image sensor corresponding to FIG. 2.
Figure 5:
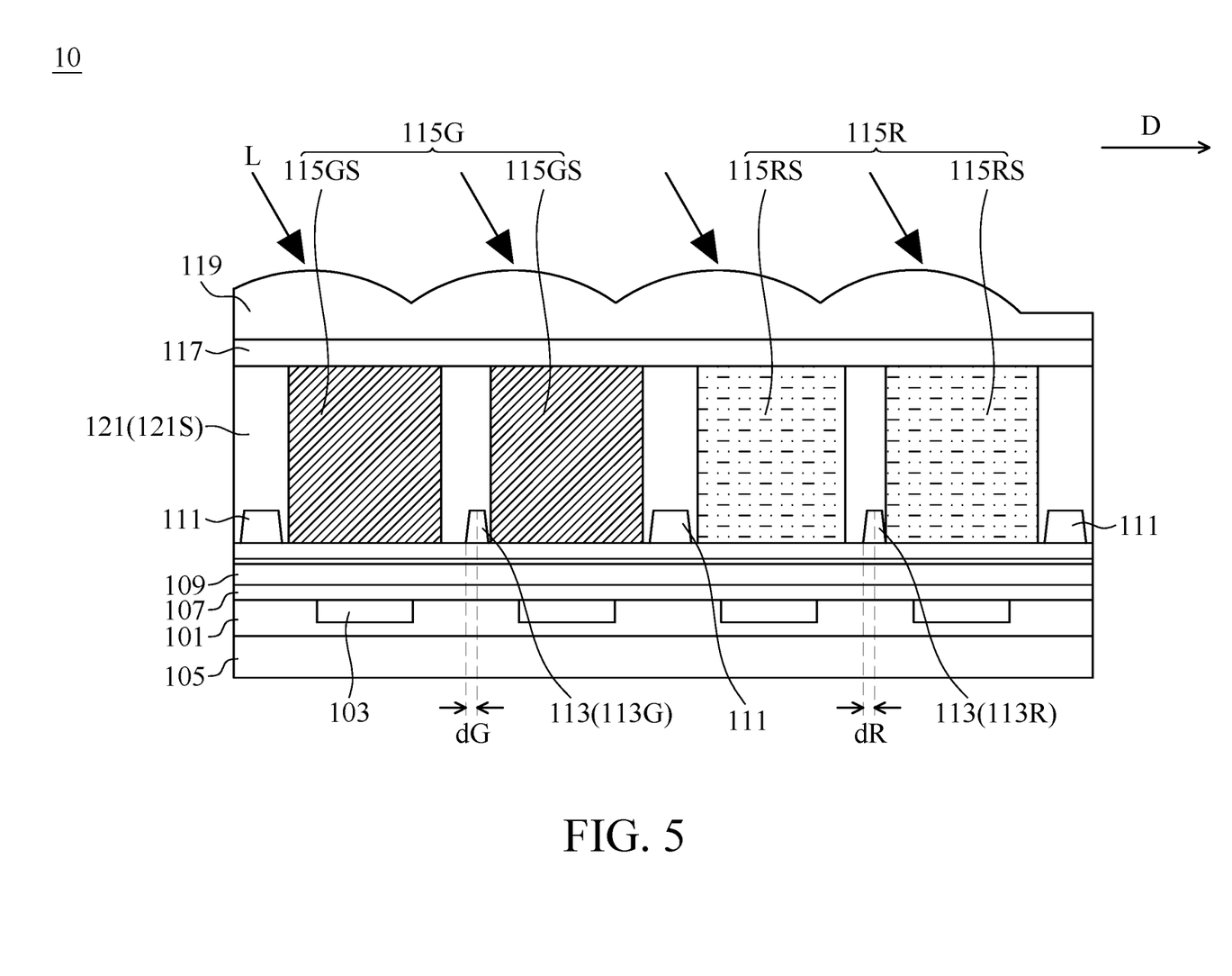
FIG. 5 is another cross-sectional view of the solid-state image sensor corresponding to FIG. 3.

FIG. 4 is another cross-sectional view of the solid-state image sensor 10 corresponding to FIG. 2. FIG. 5 is another cross-sectional view of the solid-state image sensor 10 corresponding to FIG. 3. For example, FIG. 2 and FIG. 3 are cross-sectional views corresponding to the center area of the solid-state image sensor 10, and FIG. 4 and FIG. 5 are cross-sectional views corresponding to the edge (or periphery) area (that is outside the center area) of the solid-state image sensor 10.

Referring to FIG. 4 and FIG. 5, in the edge area of the solid-state image sensor 10, the second metal grid structure 113 may have a shift relative to the center line of the corresponding partition grid segment 121S. For example, the second metal grid structure 113 between the green color filter segments 115GS (i.e., the second metal grid structure 113G) may have a shift dG relative to the center line of the corresponding partition grid segment 121S as shown in FIG. 4 and FIG. 5, the second metal grid structure 113 between the blue color filter segments 115BS (i.e., the second metal grid structure 113B) may have a shift dB relative to the center line of the corresponding partition grid segment 121S as shown in FIG. 4, and the second metal grid structure 113 between the red color filter segments 115RS (i.e., the second metal grid structure 113R) may have a shift dR relative to the center line of the corresponding partition grid segment 121S as shown in FIG. 5.

In some embodiments, the shift of the second metal grid structure 113 relative to the center line of the corresponding partition grid segment 121S may be variable. That is, the shift dG, the shift dB, and the shift dR may be different as shown in FIG. 4 and FIG. 5, but the present disclosure is not limited thereto. In some embodiments, the difference between the shift dG and shift dB or the difference between the shift dG and the shift dR may be about 0-50 nm (i.e., dG-dB=0±50 nm or dG-dR=0±50 nm), but the present disclosure is not limited thereto.

Moreover, in some embodiments, in the horizontal direction, the second metal grid structure 113 is shifted toward the side facing away from the incident light L. For example, as shown in FIG. 4 and FIG. 5, the horizontal direction D may be the direction parallel with the top surfaces of the green color filter layer 115G, the blue color filter layer 115B, and the red color filter layer 115R, the incident light L is from the left side, and the second metal grid structure 113 (e.g., the second metal grid structure 113G, the second metal grid structure 113B, the second metal grid structure 113R) is shifted toward the right side, but the present disclosure is not limited thereto.

In some embodiments, the condensing structures 119 may also have a shift relative to the color filter layers (e.g., the green color filter layers 115G, the blue color filter layers 115B, the red color filter layers 115R) in the edge area of the solid-state image sensor 10 as shown in FIG. 4 and FIG. 5, but the present disclosure is not limited thereto.

In the foregoing embodiments, the partition grid structure 121 is completely covers the second metal grid structure 113. That is, the second metal grid structure 113 may be disposed inside the partition grid structure 121, but the present disclosure is not limited thereto.

Figure 6:
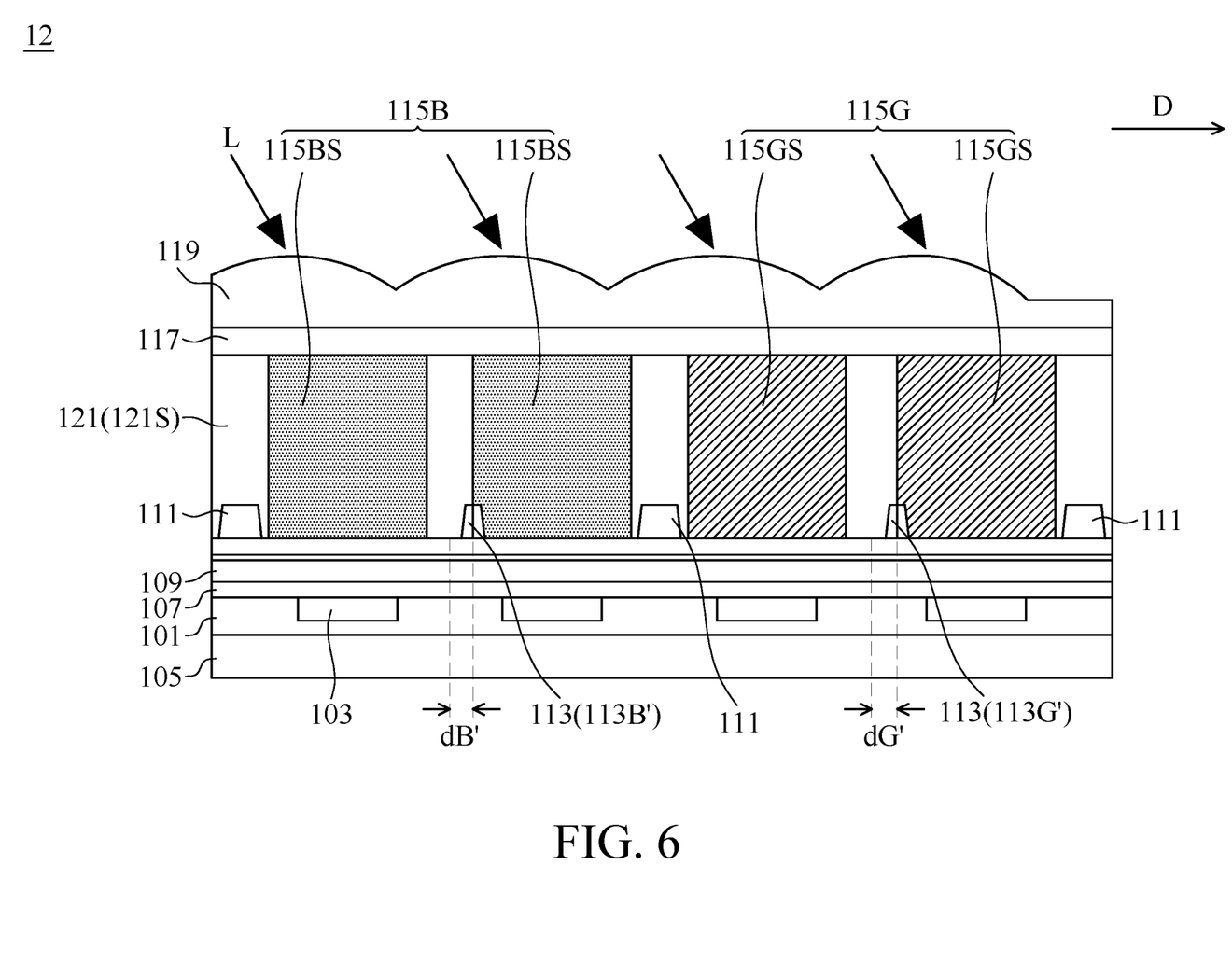
FIG. 6 is a cross-sectional view illustrating a solid-state image sensor according to another embodiment of the disclosure.

FIG. 6 is a cross-sectional view illustrating a solid-state image sensor 12 according to another embodiment of the disclosure. The solid-state image sensor 12 shown in FIG. 6 has a similar structure to the solid-state image sensor 10 shown in FIG. 4. Moreover, FIG. 6 is a cross-sectional view corresponding to the edge area of the solid-state image sensor 12.

Referring to FIG. 6, the difference from the solid-state image sensor 10 shown in FIG. 4 is that the color filter layers of the solid-state image sensor 12 shown in FIG. 6 may cover a portion of the second metal grid structure 113. In more detail, as shown in FIG. 6, the blue filter layer 115B (the blue filter layer segment 115BS) may cover a portion of the second metal grid structure 113B', and the green filter layer 115G (the green filter layer segment 115GS) may cover a portion of the second metal grid structure 113G'. That is, compared with the solid-state image sensor 10 shown in FIG. 4, the shift dB' may be greater than the shift dB, and the shift dG' may be greater than the shift dG, so that a portion of the second metal grid structure 113 may exceed the corresponding partition grid segments 121S, but the present disclosure is not limited thereto.

Figure 7:
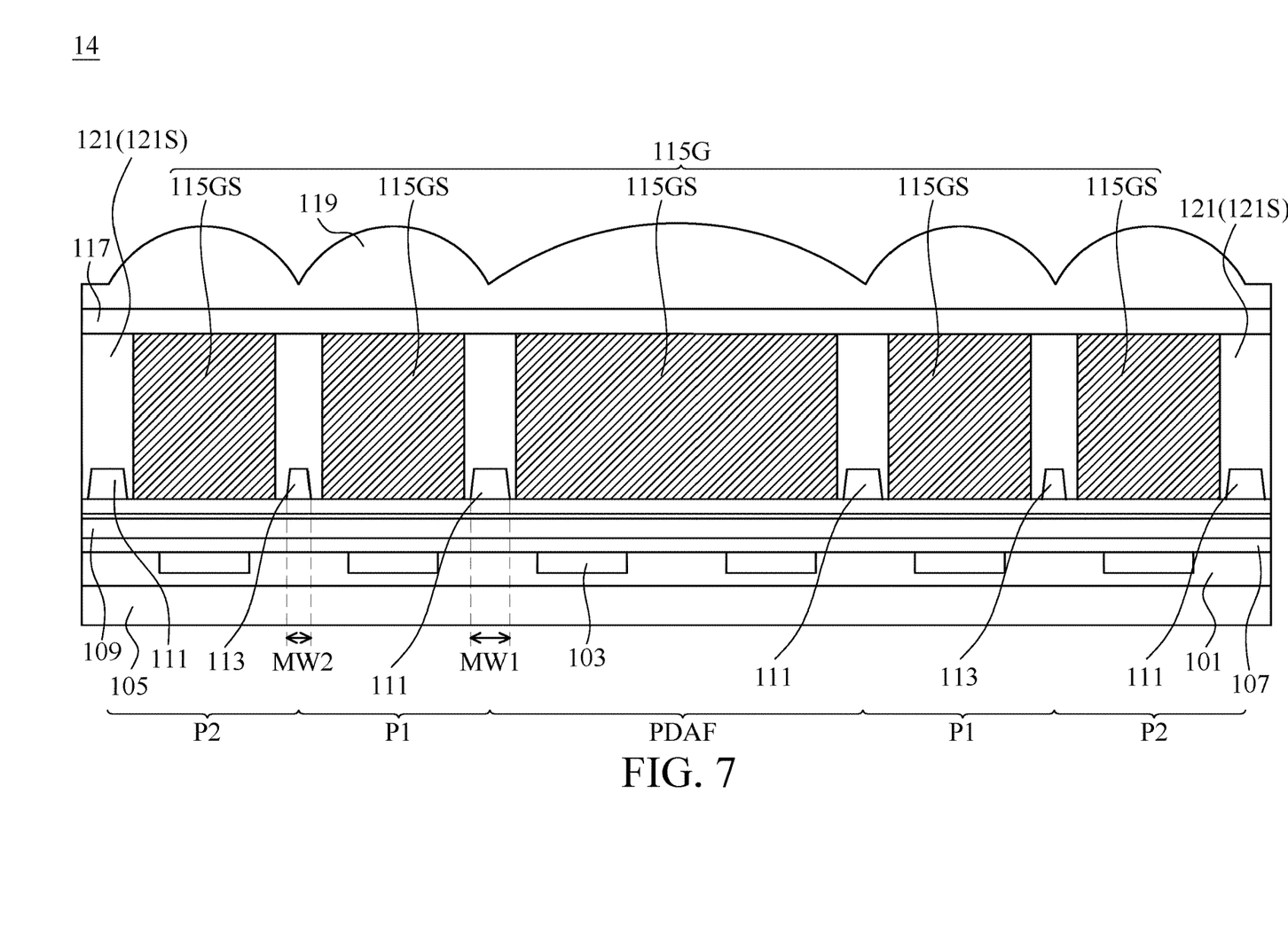
FIG. 7 is a cross-sectional view illustrating a solid-state image sensor according to another embodiment of the disclosure.
Figure 8:
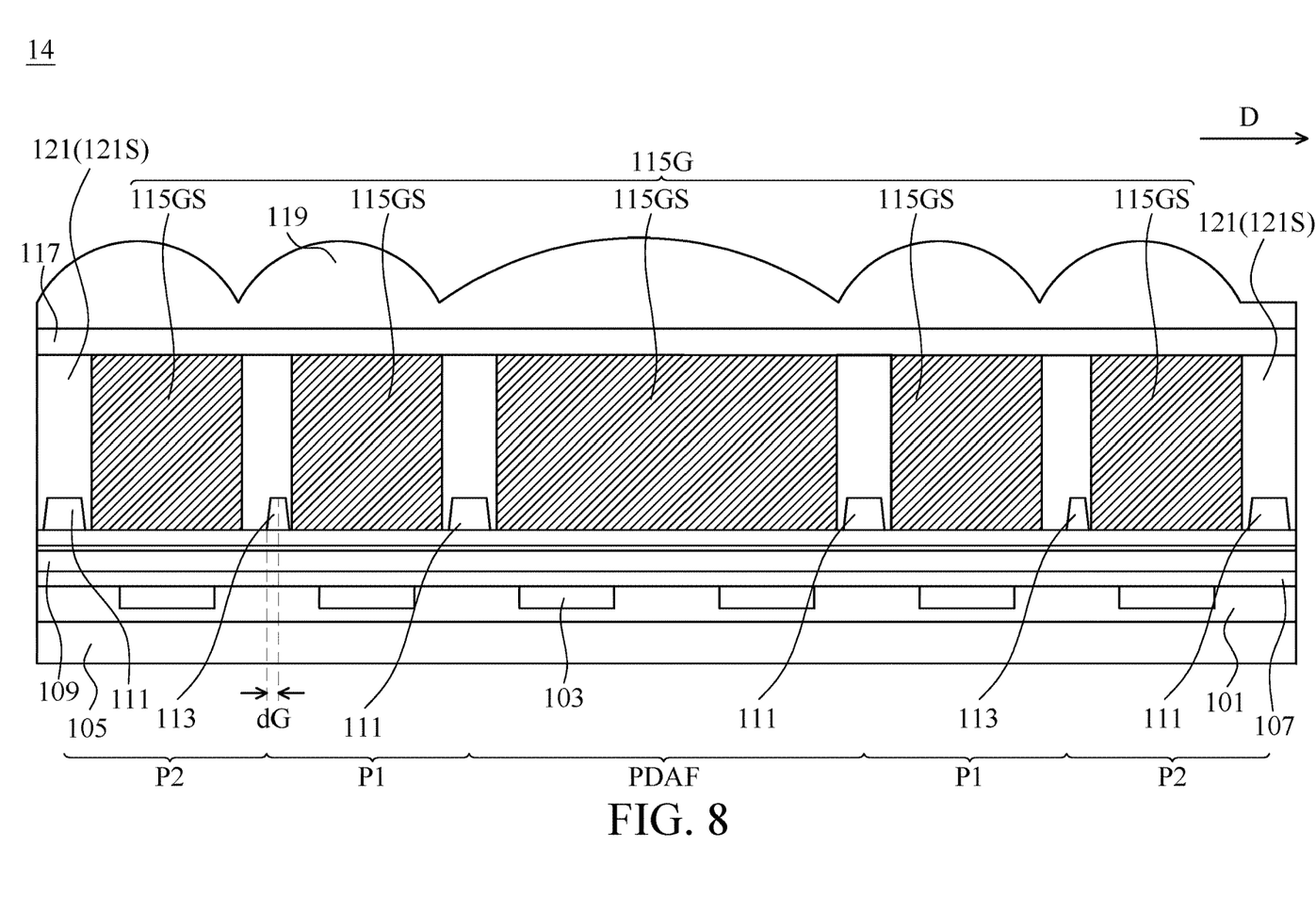
FIG. 8 is another cross-sectional view of the solid-state image sensor corresponding to FIG. 7.

FIG. 7 is a cross-sectional view illustrating a solid-state image sensor 14 according to another embodiment of the disclosure. FIG. 8 is another cross-sectional view of the solid-state image sensor 14 corresponding to FIG. 7. For example, FIG. 7 is a cross-sectional view corresponding to the center area of the solid-state image sensor 14, and FIG. 8 is a cross-sectional view corresponding to the edge (or periphery) area (that is outside the center area) of the solid-state image sensor 14.

Referring to FIG. 7 and FIG. 8, the photoelectric conversion elements 103 of the solid-state image sensor 14 may be arranged to correspond to a plurality of phase detection auto focus pixels PDAF, a plurality of first normal pixels P1 surrounding the phase detection auto focus pixels PDAF, and a plurality of second normal pixels P2 surrounding the first normal pixels P1.

In this embodiment, in the region corresponding to the phase detection auto focus pixels PDAF, each color filter segment (e.g., green color filter segment 115GS) may correspond to at least two photoelectric conversion elements 103; in the region corresponding to the first normal pixels P1 or the second normal pixels P2, each color filter segment (e.g., green color filter segment 115GS) may correspond to one photoelectric conversion element 103, but the present disclosure is not limited thereto.

In some embodiments, as shown in FIG. 7 and FIG. 8, the first metal grid structure 111 may be disposed to correspond to the region between the phase detection auto focus pixels PDAF and the first normal pixels P1, and the second metal grid structure 113 may be disposed to correspond to the region between the first normal pixels P1 and the of second normal pixels P2, but the present disclosure is not limited thereto.

Similarly, in this embodiment, the bottom of the first metal grid structure 111 has a first grid width MW1, and the bottom of the second metal grid structure 113 has a second grid width MW2 that is narrower than the first grid width MW1. In some embodiments, the ratio of the second grid width MW2 to the first grid width MW1 may be about 0.25 to about 0.9 (i.e., MW2/MW1=0.25 to 0.9), but the present disclosure is not limited thereto. Moreover, in the edge area of the solid-state image sensor 14, the second metal grid structure 113 may have a shift (e.g., the shift dG) relative to the center line of the corresponding partition grid segment 121S.

Figure 9:
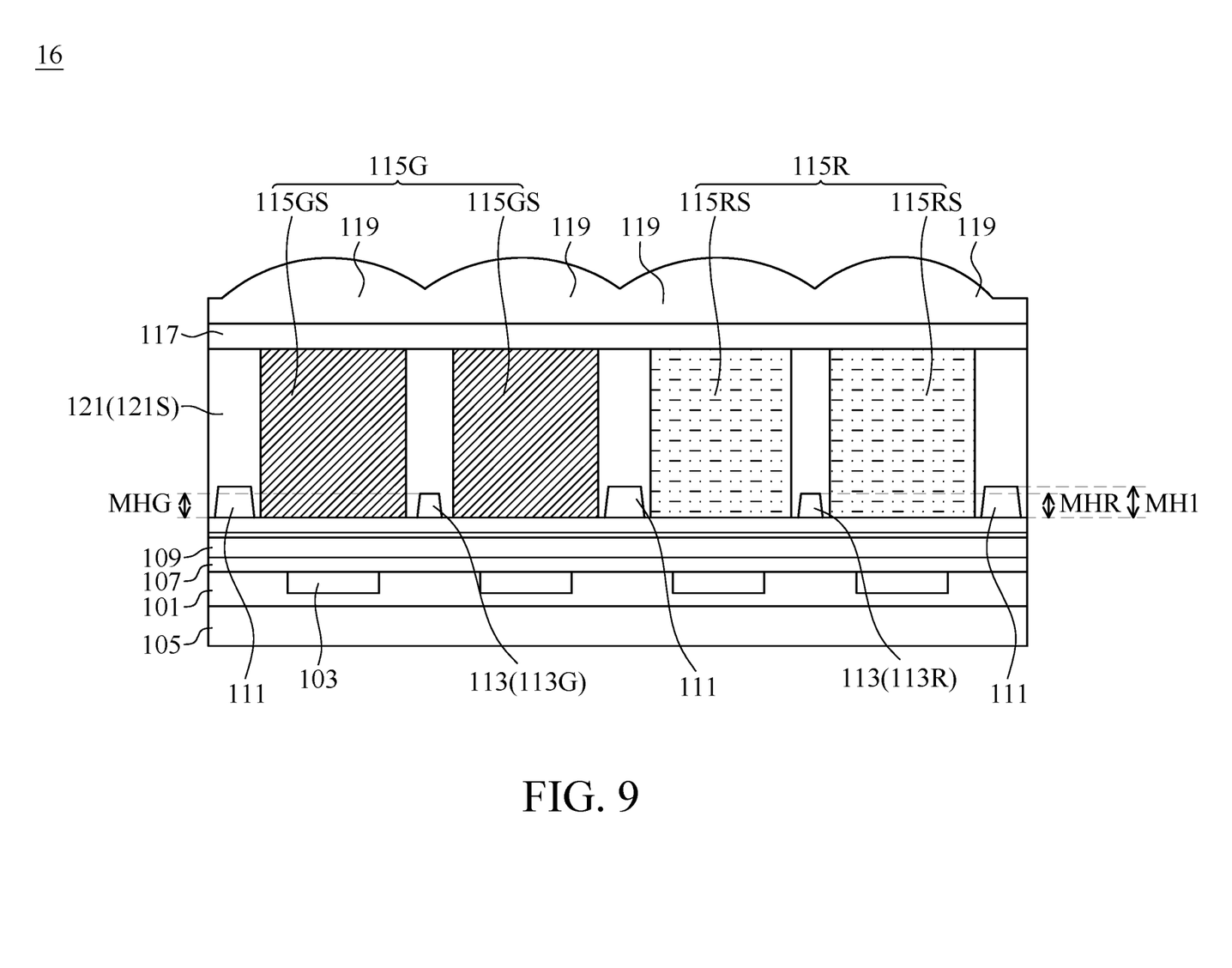
FIG. 9 is a cross-sectional view of a solid-state image sensor according to one embodiment of the disclosure.

FIG. 9 is a cross-sectional view of a solid-state image sensor 16 according to one embodiment of the disclosure. Referring to FIG. 9, the solid-state image sensor 16 may have similar structure to the solid-state image sensor 10 shown in FIG. 3. The difference from the solid-state image sensor 10 shown in FIG. 3 is that in the solid-state image sensor 16 shown in FIG. 9, the first metal grid structure 111 may have a first grid height MH1, and the second metal grid structure 113 may have a second grid height MEM (or MHG). In this embodiments, the second grid height MEM (or MHG) may be lower than the first grid height MH1 (i.e., MHR<MH1 or MHG<MH1).

Moreover, in some embodiments, the second grid height of the second metal grid structure 113 may be variable. For example, as shown in FIG. 9, the second grid height MEM may be greater than the second grid height MHG, but the present disclosure is not limited thereto.

In the foregoing embodiments, the first metal grid structure 111 and the second metal grid structure 113 are illustrated as being formed as trapezoids in the cross-sectional view of the solid-state image sensor, but the present disclosure is not limited thereto.

Figure 10:
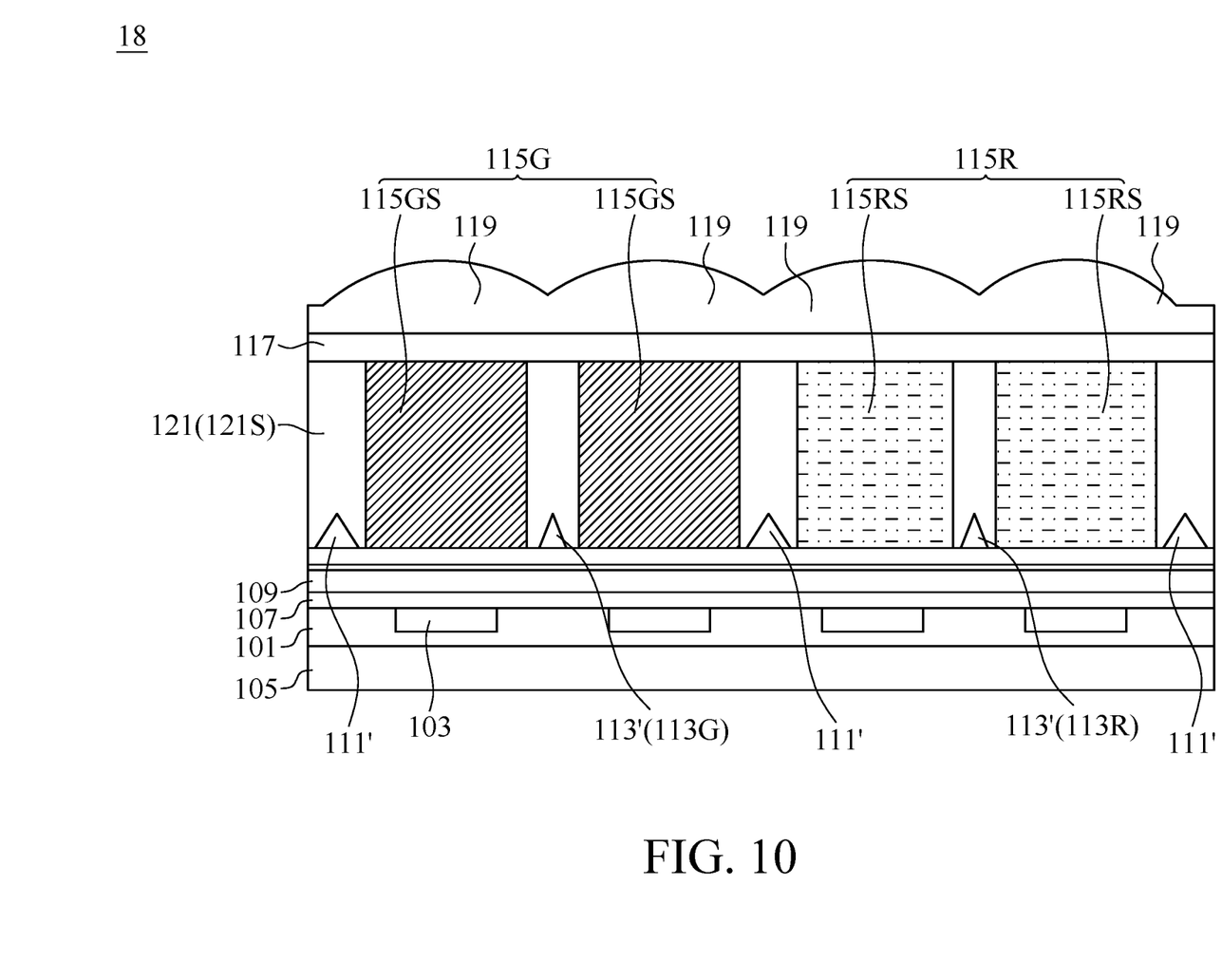
FIG. 10 is a cross-sectional view of a solid-state image sensor according to one embodiment of the disclosure.
Figure 11:
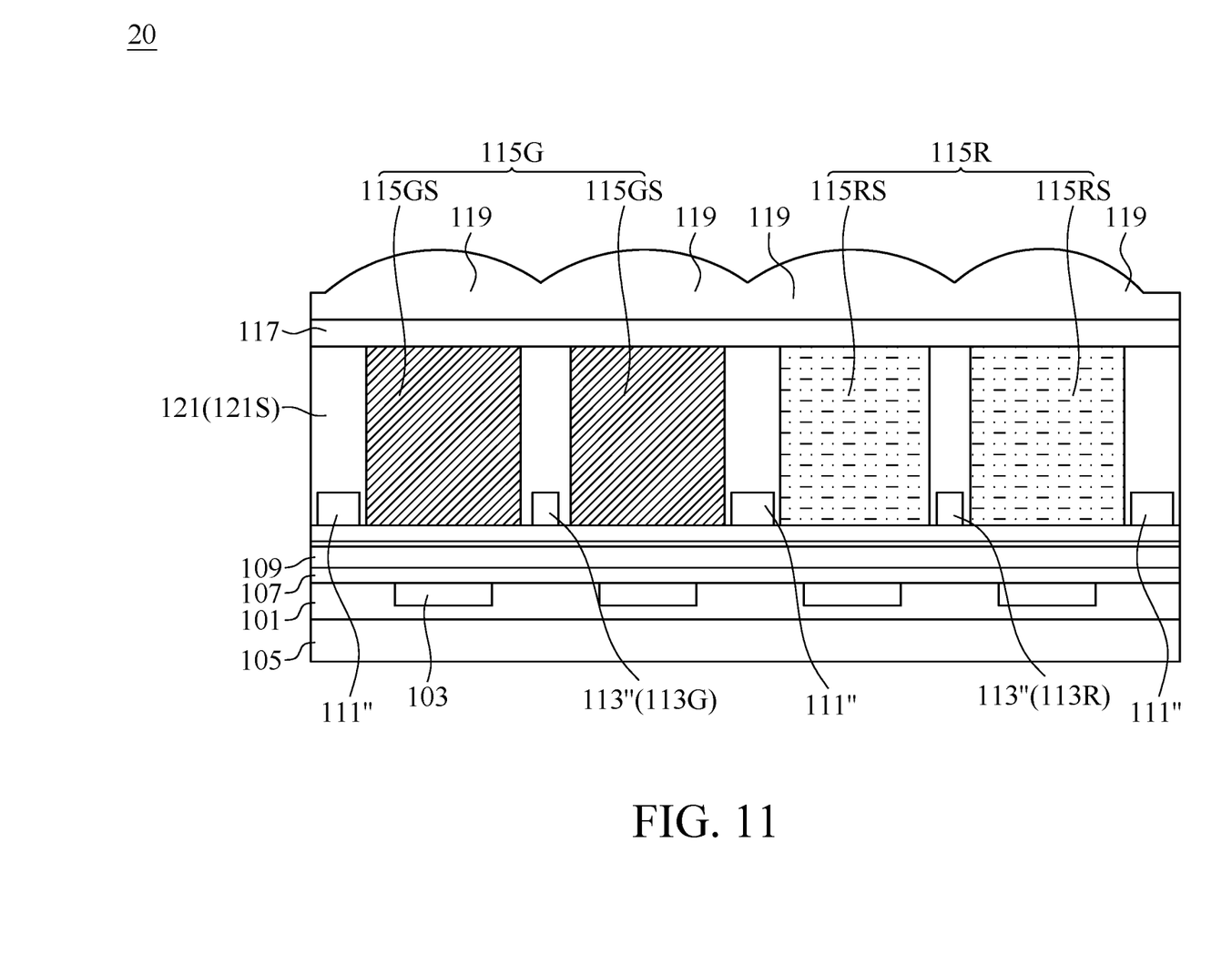
FIG. 11 is a cross-sectional view of a solid-state image sensor according to another embodiment of the disclosure.

FIG. 10 is a cross-sectional view of a solid-state image sensor 18 according to one embodiment of the disclosure. FIG. 11 is a cross-sectional view of a solid-state image sensor 20 according to another embodiment of the disclosure. Referring to FIG. 10, in the cross-sectional view of the solid-state image sensor 18, the first metal grid structure 111' and the second metal grid structure 113' are formed as triangles, but the present disclosure is not limited thereto. Referring to FIG. 11, in the cross-sectional view of the solid-state image sensor 20, the first metal grid structure 111" and the second metal grid structure 113" are formed as rectangles, but the present disclosure is not limited thereto.

Figure 12:
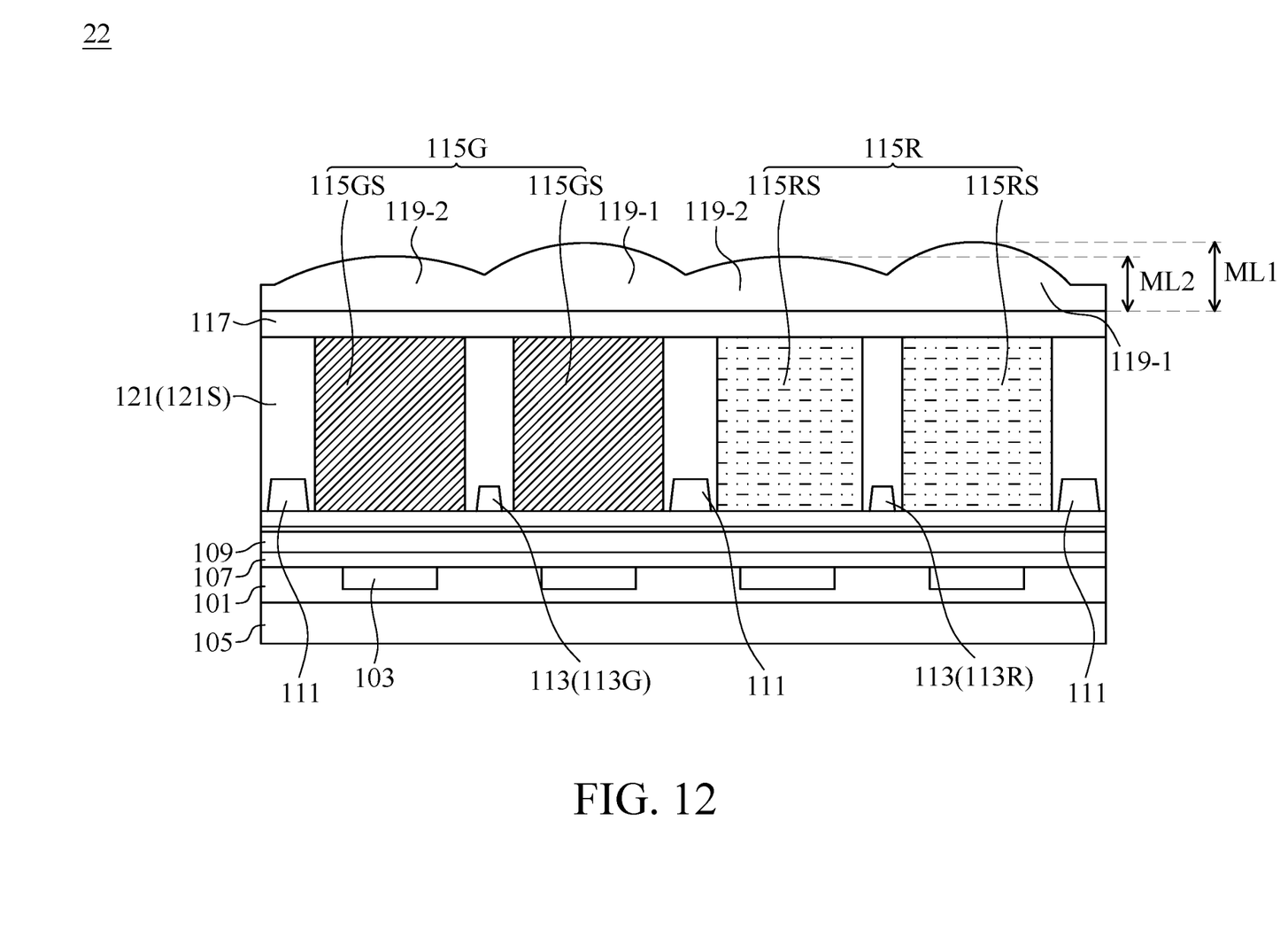
FIG. 12 is a cross-sectional view of a solid-state image sensor according to one embodiment of the disclosure.

FIG. 12 is a cross-sectional view of a solid-state image sensor 22 according to one embodiment of the disclosure. Referring to FIG. 12, the solid-state image sensor 22 may have similar structure to the solid-state image sensor 10 shown in FIG. 3. The difference from the solid-state image sensor 10 shown in FIG. 3 is that thicknesses of the condensing structures (119-1, 119-2) of the solid-state image sensor 22 may be different. In more detail, as shown in FIG. 12, the solid-state image sensor 22 may include a plurality of first condensing structures 119-1 and a plurality of second condensing structures 119-2 disposed on the color filter layers (e.g., the green color filter layers 115G, the blue color filter layers 115B, the red color filter layers 115R). In this embodiment, the first condensing structures 119-1 may have a first thickness ML1, the second condensing structures 119-2 may have a second thickness ML2, and the first thickness ML1 may be greater than the second thickness ML2, but the present disclosure is not limited thereto.

In summary, compared with traditional grid structures with a constant metal grid width, the solid-state image sensor in the embodiments of the present disclosure includes the first metal grid structure and the second metal grid structure that have different widths, which may improve channel separation, thereby improving the quality of the image signal from the photoelectric conversion elements of the solid-state image sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A solid-state image sensor, comprising:
    a plurality of photoelectric conversion elements;
    a first color filter layer disposed above the plurality of photoelectric conversion elements, and having a plurality of first color filter segments;
    a second color filter layer disposed above the plurality of photoelectric conversion elements and adjacent to the first color filter layer, and having a plurality of second color filter segments;
    a first metal grid structure disposed between the first color filter layer and the second color filter layer; and
    a second metal grid structure disposed between two of the plurality of first color filter segments in the first color filter layer and disposed between two of the plurality of second color filter segments in the second color filter layer,
    wherein a bottom of the first metal grid structure has a first grid width, and a bottom of the second metal grid structure has a second grid width that is narrower than the first grid width, wherein the bottom of the first metal grid structure and the bottom of the second metal grid structure are coplanar;
    wherein the second metal grid structure has a shift relative to a center line of a gap area between two of the plurality of first color filter segments in the first color filter layer or relative to a center line of a gap area between two of the plurality of second color filter segments in the second color filter layer.

2. The solid-state image sensor as claimed in claim 1, wherein the plurality of first color filter segments includes green color filter segments, and the plurality of second color filter segments includes blue/red color filter segments.

3. The solid-state image sensor as claimed in claim 2, wherein the bottom of the second metal grid structure between the green color filter segments has a green grid width, and the bottom of the second metal grid structure between the blue/red color filter segments has a blue/red grid width that is different from the green grid width.

4. The solid-state image sensor as claimed in claim 3, wherein a difference between the green grid width and the blue/red grid width is less than 50 nm.

5. The solid-state image sensor as claimed in claim 1, further comprising:
    a partition grid structure disposed on the first metal grid structure and the second metal grid structure,
    wherein in a cross-sectional view of the solid-state image sensor, the partition grid structure is divided into a plurality of partition grid segments.

6. The solid-state image sensor as claimed in claim 5, wherein the partition grid structure has a partition grid width greater than or equal to the first grid width.

7. The solid-state image sensor as claimed in claim 5, wherein the shift of the second metal grid is relative to a center line of each of the plurality of partition grid segments in an edge area of the solid-state image sensor.

8. The solid-state image sensor as claimed in claim 7, wherein the shift is variable.

9. The solid-state image sensor as claimed in claim 7, wherein the plurality of first color filter segments includes green color filter segments, and the plurality of second color filter segments includes blue/red color filter segments.

10. The solid-state image sensor as claimed in claim 9, wherein the second metal grid structure between the green color filter segments has a first shift and the second metal grid structure between the blue/red color filter segments has a second shift relative to the center line of each of the plurality of partition grid segments in the edge area of the solid-state image sensor, and the first shift and the second shift are different.

11. The solid-state image sensor as claimed in claim 10, wherein a difference between the first shift and the second shift less than 50 nm.

12. The solid-state image sensor as claimed in claim 7, wherein in a horizontal direction, the second metal grid structure is shifted toward a side facing away from an incident light.

13. The solid-state image sensor as claimed in claim 7, wherein the first color filter layer or the second color filter layer covers a portion of the second metal grid structure.

14. The solid-state image sensor as claimed in claim 1, wherein the plurality of photoelectric conversion elements is arranged to correspond to a plurality of phase detection auto focus pixels, a plurality of first normal pixels surrounding the plurality of phase detection auto focus pixels, and a plurality of second normal pixels surrounding the plurality of first normal pixels.

15. The solid-state image sensor as claimed in claim 14, wherein the first metal grid structure is disposed to correspond to a region between the plurality of phase detection auto focus pixels and the plurality of first normal pixels, and the second metal grid structure is disposed to correspond to a region between the plurality of first normal pixels and the plurality of second normal pixels.

16. The solid-state image sensor as claimed in claim 1, wherein in a cross-sectional view of the solid-state image sensor, the first metal grid structure and the second grid structure are formed as trapezoids, triangles, or rectangles.

17. The solid-state image sensor as claimed in claim 1, further comprising:
   a plurality of condensing structures disposed on the first color filter layer and the second color filter layer.

18. The solid-state image sensor as claimed in claim 17, wherein a thickness of the plurality of condensing structures is different.

19. The solid-state image sensor as claimed in claim 1, wherein a ratio of the second grid width to the first grid width is 0.25-0.9.

* * * * *